US006966110B2

(12) United States Patent
DeBar et al.

(10) Patent No.: US 6,966,110 B2
(45) Date of Patent: Nov. 22, 2005

(54) FABRICATION OF LIQUID EMISSION DEVICE WITH SYMMETRICAL ELECTROSTATIC MANDREL

(75) Inventors: Michael J. DeBar, Rochester, NY (US); Gilbert A. Hawkins, Mendon, NY (US); James M. Chwalek, Pittsford, NY (US)

(73) Assignee: Eastman Kodak Company, Rochester, NY (US)

( * ) Notice: Subject to any disclaimer, the term of this patent is extended or adjusted under 35 U.S.C. 154(b) by 567 days.

(21) Appl. No.: 10/254,350

(22) Filed: Sep. 25, 2002

(65) Prior Publication Data

US 2004/0055126 A1 Mar. 25, 2004

(51) Int. Cl.[7] .......................... B21D 53/76; H05K 3/10

(52) U.S. Cl. ........................ 29/890.1; 29/846; 29/831; 29/DIG. 37; 427/97.1; 427/97.3; 427/259; 216/18; 216/27; 347/47; 347/55

(58) Field of Search .......................... 29/890.1, 25.35, 29/611, 846, 847, DIG. 16, DIG. 37, 831; 216/13, 18, 27; 427/97.1, 97.3, 98.4, 99.3, 427/259, 282; 438/21; 347/47, 55

(56) References Cited

U.S. PATENT DOCUMENTS

| | | | | |
|---|---|---|---|---|
| 5,244,537 | A * | 9/1993 | Ohnstein | 216/18 |
| 5,644,341 | A | 7/1997 | Fujii et al. | |
| 5,668,579 | A | 9/1997 | Fujii et al. | |
| 5,739,831 | A | 4/1998 | Nakamura et al. | |
| 6,127,198 | A | 10/2000 | Coleman et al. | |
| 6,318,841 | B1 | 11/2001 | Coleman et al. | |
| 6,322,201 | B1 | 11/2001 | Beatty et al. | |
| 6,345,884 | B1 | 2/2002 | Yoon et al. | |
| 6,357,865 | B1 | 3/2002 | Kubby et al. | |
| 6,662,448 | B2 * | 12/2003 | Kubby et al. | 29/890.1 |
| 2001/0023523 | A1 | 9/2001 | Kubby et al. | |

FOREIGN PATENT DOCUMENTS

| | | | |
|---|---|---|---|
| JP | 4-344253 | * 11/1992 | 29/890.1 |

OTHER PUBLICATIONS

Yazdi et al., "An All-Silicon Single-Wafer Micro-g Accelerometer with a Combined Surface and Bulk Micromachining Process", Journal of Microelectromechanical Systems, vol. 9, No. 4, Dec. 2000.*

Patent Abstracts of Japan, Publication No. 10000770, Publication date Jun. 1, 1998, application date: Jun. 17, 1006, application number 08155125, Applicant: Fuji Xerox Co., Ltd, Title: Inkjet Recording Apparatus.

Patent Abstract of Japan, Publication No. 11309850, Publication date: Nov. 9, 1999, Application date: April 28, 1998, Application number 10119436, Applicant: Minolta Co., Ltd., Title: Ink Jet Head Driver Therefor and Ink Jet Recorder.

* cited by examiner

*Primary Examiner*—A. Dexter Tugbang
(74) *Attorney, Agent, or Firm*—Milton S. Sales

(57) ABSTRACT

A method of fabricating a liquid emission device includes a chamber having a nozzle orifice. Separately addressable dual electrodes are positioned on opposite sides of a central electrode. The three electrodes are aligned with the nozzle orifice. A rigid electrically insulating coupler connects the two addressable electrodes. To eject a drop, an electrostatic charge is applied to the addressable electrode nearest to the nozzle orifice, which pulls that electrode away from the orifice, drawing liquid into the expanding chamber. The other addressable electrode moves in conjunction, storing potential energy in the system. Subsequently the addressable electrode nearest to the nozzle is de-energized and the other addressable electrode is energized, causing the other electrode to be pulled toward the central electrode in conjunction with the release of the stored elastic potential energy. This action pressurizes the liquid in the chamber behind the nozzle orifice, causing a drop to be ejected from the nozzle orifice.

7 Claims, 13 Drawing Sheets

FABRICATION OF LIQUID EMISSION DEVICE WITH SYMMETRICAL ELECTROSTATIC MANDREL

CROSS-REFERENCE TO RELATED APPLICATION

Reference is made to commonly assigned, co-pending U.S. patent application Ser. No. 10/155,306 filed in the names of Gilbert A. Hawkins et al on May 23, 2002.

FIELD OF THE INVENTION

The present invention relates generally to micro-electromechanical (MEM) drop-on-demand liquid emission devices such as, for example, ink jet printers, and more particularly such devices which employ an electrostatic actuator for driving liquid from the device.

BACKGROUND OF THE INVENTION

Drop-on-demand liquid emission devices with electrostatic actuators are known for ink printing systems. U.S. Pat. No. 5,644,341 and No. 5,668,579, which issued to Fujii et al. on Jul. 1, 1997 and Sep. 16, 1997, respectively, disclose such devices having electrostatic actuators composed of a single diaphragm and opposed electrode. The diaphragm is distorted by application of a first voltage to the electrode. Relaxation of the diaphragm expels an ink droplet from the device. Other devices that operate on the principle of electrostatic attraction are disclosed in U.S. Pat. No. 5,739,831, No. 6,127,198, and No. 6,318,841; and in U.S. Publication No. 2001/0023523.

U.S. Pat. No. 6,345,884, teaches a device having an electrostatically deformable membrane with an ink refill hole in the membrane. An electric field applied across the ink deflects the membrane and expels an ink drop.

IEEE Conference Proceeding "MEMS 1998," held Jan. 25–29, 2002 in Heidelberg, Germany, entitled "A Low Power, Small, Electrostatically-Driven Commercial Inkjet Head" by S. Darmisuki, et al., discloses a head made by anodically bonding three substrates, two of glass and one of silicon, to form an ink ejector. Drops from an ink cavity are expelled through an orifice in the top glass plate when a membrane formed in the silicon substrate is first pulled down to contact a conductor on the lower glass plate and subsequently released. There is no electric field in the ink. The device occupies a large area and is expensive to manufacture.

U.S. Pat. No. 6,357,865 by J. Kubby et al. teaches a surface micro-machined drop ejector made with deposited polysilicon layers. Drops from an ink cavity are expelled through an orifice in an upper polysilicon layer when a lower polysilicon layer is first pulled down to contact a conductor and is subsequently released.

One such device is disclosed in co-pending U.S. patent application Ser. No. 10/155,306 filed in the names of Gilbert A. Hawkins et al on May 23, 2002. That device includes an electrostatic drop ejection mechanism that employs an electric field for driving liquid from a chamber in the device. Structurally coupled, separately addressable first and second dual electrodes are movable in a first direction to draw liquid into the chamber and in a second direction to emit a liquid drop from the chamber. A third electrode between the dual electrodes has opposed surfaces respectively facing each of said first and second electrodes at an angle of contact whereby movement of the dual electrodes in one of the first and second directions progressively increases contact between the first and third electrodes, and movement of the dual electrodes in the direction progressively increases contact between the second and third electrodes.

SUMMARY OF THE INVENTION

The device described in the Hawkins et al. patent application, and other multi-layer micro-electromechanical electrostatic actuators for liquid emission devices, can be manufactured by chemical mechanical polishing in combination with a sacrificial layer to produce a member, having non-planar surfaces, that can move within a trench left when the sacrificial layer is removed to provide a separation from stationary parts.

According to a feature of the present invention, a method of making a multi-layer micro-electromechanical electrostatic actuator for producing drop-on-demand liquid emission devices, includes forming an initial patterned layer of sacrificial material on a substrate. A first electrode layer is deposited and patterned on the initial layer of sacrificial material before a preformed micropatterned conductive second electrode layer is attached to the first electrode layer. The second electrode layer is electrically isolated from the first electrode layer, and is concave on opposed sides, increasing in thickness radially from its center. A subsequent patterned layer of sacrificial material is formed on the second electrode layer such that a region of the first electrode layer is exposed through an opening through the subsequent layer of sacrificial material. A structure is deposited and patterned on the subsequent layer of sacrificial material to a depth so as to at least fill the opening through the subsequent layer of sacrificial material. A third electrode layer is deposited and patterned on the structure and the exposed surface of the subsequent layer of sacrificial material, whereby the first electrode layer and the third electrode layer are attached by the structure. The sacrificial material is removed from the initial layer and the subsequent layer, whereby the first electrode layer, the structure, and the third electrode layer are free to move together relative to the second electrode layer.

DETAILED DESCRIPTION OF THE INVENTION

As described in detail herein below, the present invention provides a process for fabricating drop-on-demand liquid emission devices. The most familiar of such devices are used as printheads in ink jet printing systems. Many other applications are emerging which make use of devices similar to ink jet printheads, but which emit liquids (other than inks) that need to be finely metered and deposited with high spatial precision.

Figure 1:
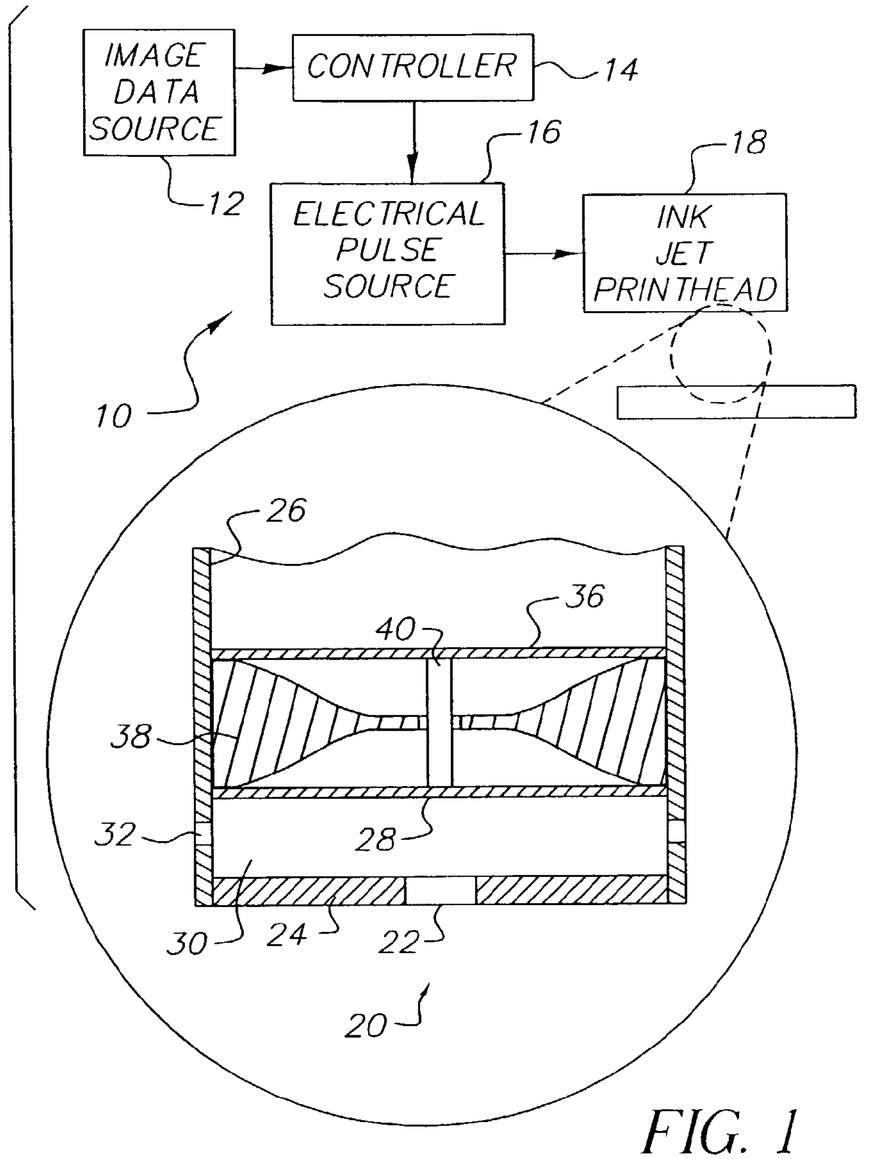
FIG. 1 is a schematic illustration of a drop-on-demand liquid emission device according to the present invention.

FIG. 1 shows a schematic representation of a drop-on-demand liquid emission device 10, such as an ink jet printer, which may be operated according to the present invention. The system includes a source 12 of data (say, image data) which provides signals that are interpreted by a controller 14 as being commands to emit drops. Controller 14 outputs signals to a source 16 of electrical energy pulses which are inputted to a drop-on-demand liquid emission device such as an ink jet printer 18.

Figure 2:
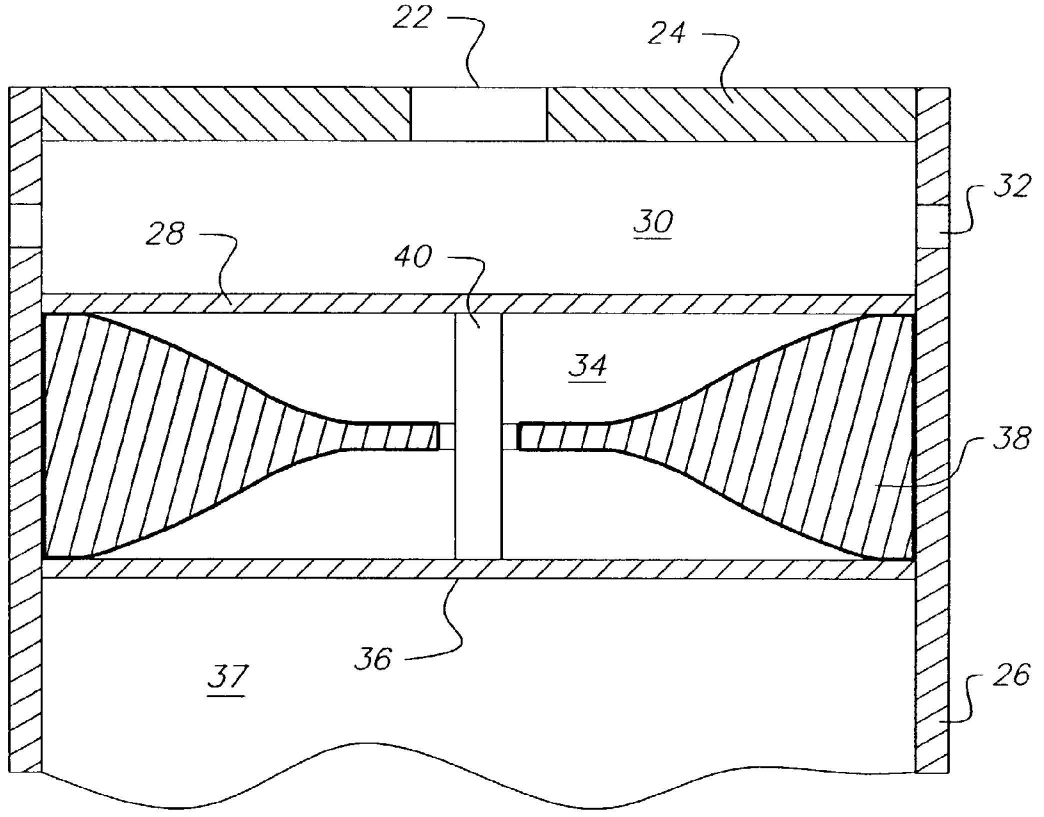
FIG. 2 is a cross-sectional view of a portion of drop-on-demand liquid emission device of FIG. 1.
Figure 24:
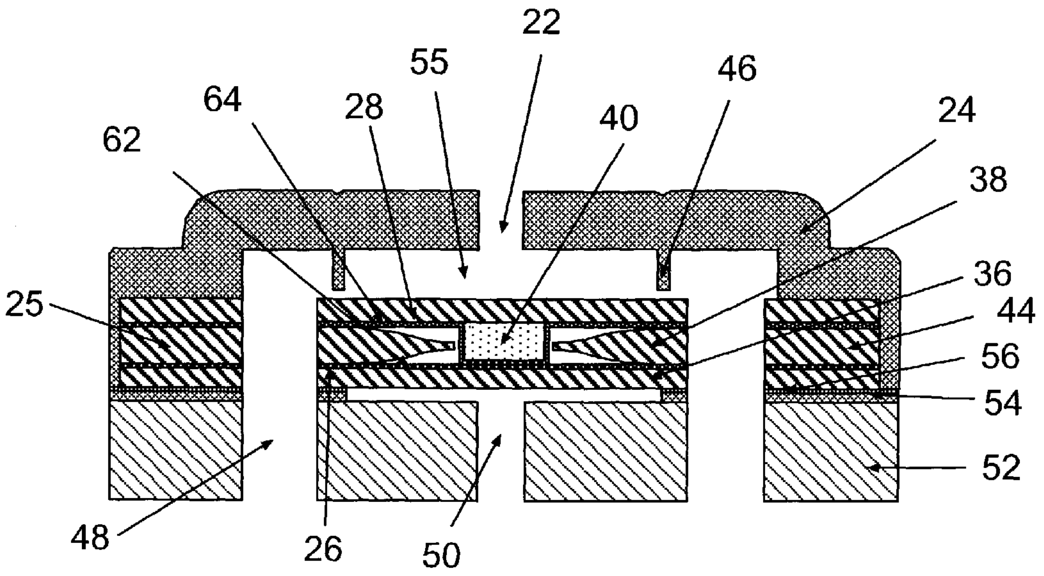
FIG. 24 shows a cross-section through D–D' of FIG. 8.

Drop-on-demand liquid emission device 10 includes a plurality of electrostatic drop ejection mechanisms 20. FIG. 2 is a cross-sectional view of one of the plurality of electrostatically actuated drop ejection mechanisms 20. A nozzle orifice 22 is formed in a nozzle plate 24 for each mechanism 20. A wall or walls 26 that carry an electrically addressable electrode 28 bound each drop ejection mechanism 20. The wall may comprise a single material as shown in FIG. 2, or may comprise a stack of material layers, as shown in FIG. 24.

A portion of electrode 28 is sealingly attached to outer wall 25 to define a liquid chamber 30 adapted to receive the liquid, such as for example ink, to be ejected from nozzle orifice 22. The liquid is drawn into chamber 30 through one or more refill ports 32 from a supply, not shown, typically forming a meniscus in the nozzle orifice. Ports 32 are sized as discussed below. Dielectric fluid fills the region 34 on the side of electrode 28 opposed to chamber 30. The dielectric fluid is preferably air or other dielectric gas, although a dielectric liquid may be used.

Typically, electrode 28 is made of a somewhat flexible conductive material such as polysilicon, or, in the preferred embodiment, a combination of layers having a central conductive layer surrounded by an upper and lower insulating layer. For example a preferred electrode 28 comprises a thin film of polysilicon stacked between two thin films of silicon nitride, each film for example, being one micron thick. In the latter case, the nitride acts to stiffen the polysilicon film and to insulate it from liquid in the chamber 30. However, due to a coupler, described below, it is not necessary that the polysilicon film be made stiffer, since the electrode may be moved in either direction solely by electrostatic attractive forces.

A second electrode 36 between chamber 30 and a cavity 37 is preferably identical in composition to electrode 28, and is electrically addressable separately from electrode 28. Addressable electrodes 28 and 36 are preferably at least partially flexible and are positioned on opposite sides of a single central electrode 38 such that the three electrodes are generally axially aligned with nozzle orifice 22. Since there is no need for addressable electrode 36 to completely seal with wall 26, its peripheral region may be mere tabs tethering the central region of electrode 36 to wall 26.

Central electrode 38 is preferably made from a conductive central body surrounded by a thin insulator of uniform thickness, for example silicon oxide or silicon nitride, and is rigidly attached to walls 26. According to a feature of the present invention, the central electrode is symmetrical top to bottom and is in contact with addressable electrode 36 along its upper and lower surfaces at wall 26. Specifically, the upper surface of central electrode 38 is concave away from addressable electrode 28, and the lower surface of central electrode 38 is concave away from addressable electrode 36.

The two addressable electrodes are structurally connected via a rigid coupler 40. This coupler is electrically insulating, which term is intended to include a coupler of conductive material but having a non-conductive break therein. Coupler 40 ties the two addressable electrodes structurally together and insolates the electrodes so as to make possible distinct voltages on the two. The coupler may be made from conformally deposited silicon dioxide.

Figure 5:
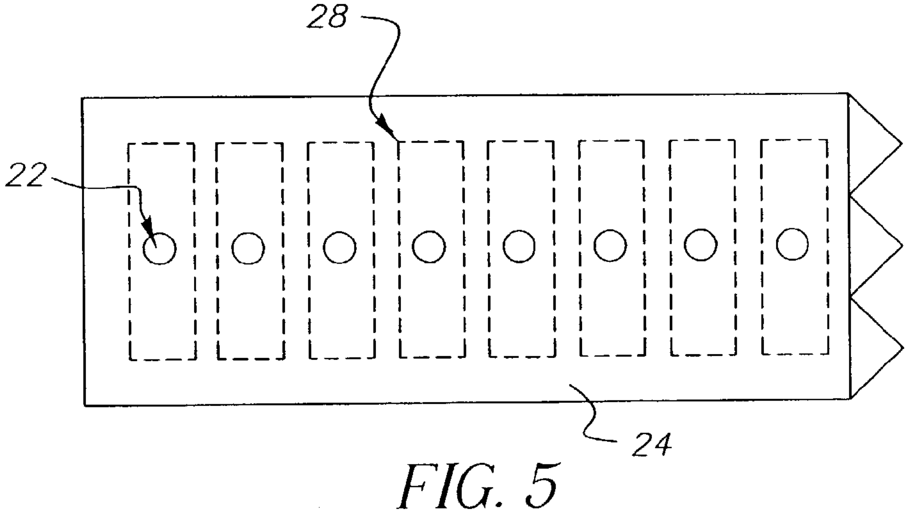
FIGS. 3–5 are top plan views of alternative embodiments of a nozzle plate of the drop-on-demand liquid emission device of FIGS. 1 and 2.
Figure 3:
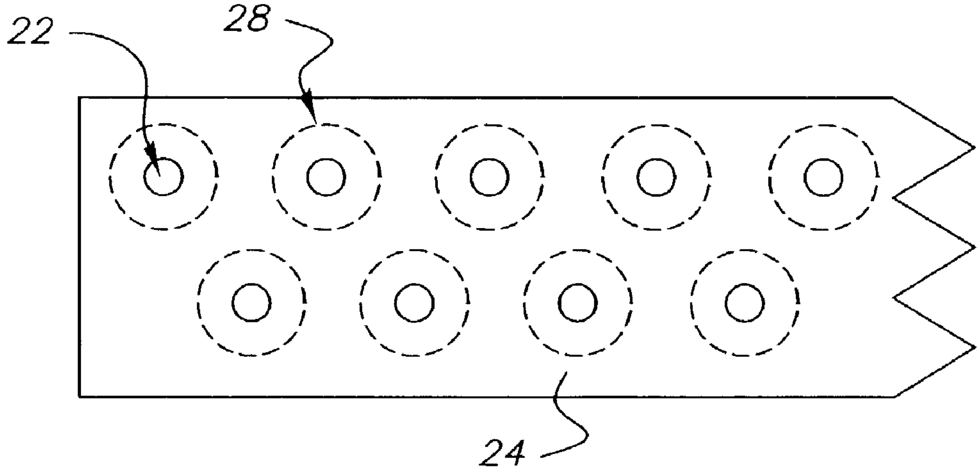
Figure 4:
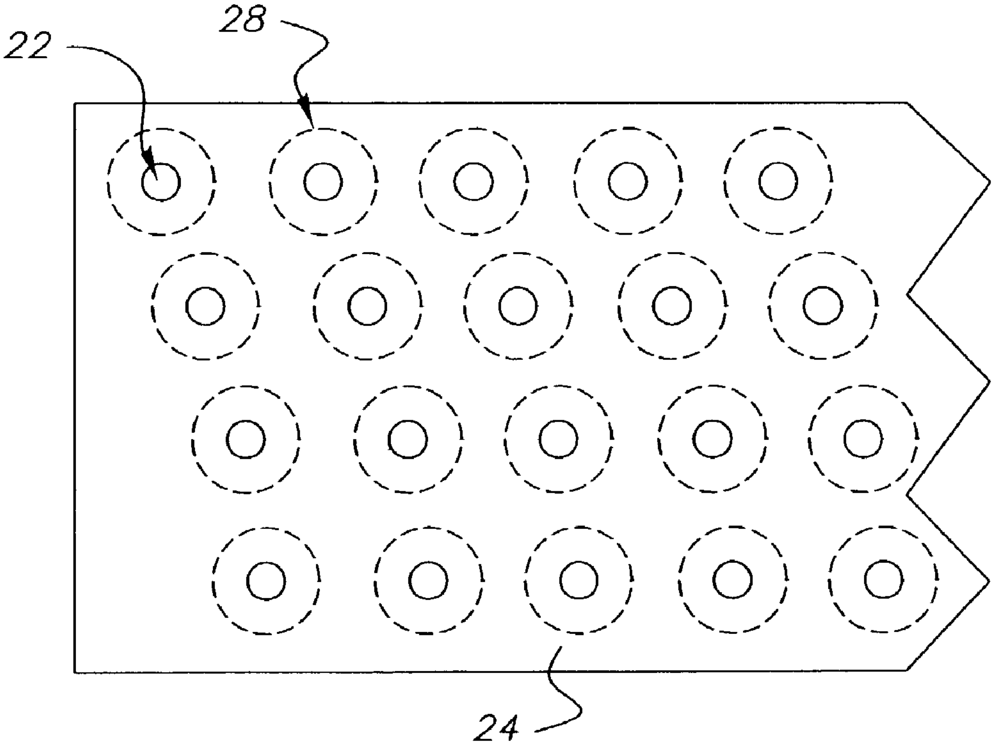

FIGS. 3–5 are top plan views of nozzle plate 24, showing several alternative embodiments of layout patterns for the several nozzle orifices 22 of a print head. Note that in FIGS. 2 and 3, the interior surface of walls 26 are annular, while in FIG. 5, walls 26 form rectangular chambers. Other shapes are of course possible, and these drawings are merely intended to convey the understanding that alternatives are possible within the spirit and scope of the present invention.

Figure 6:
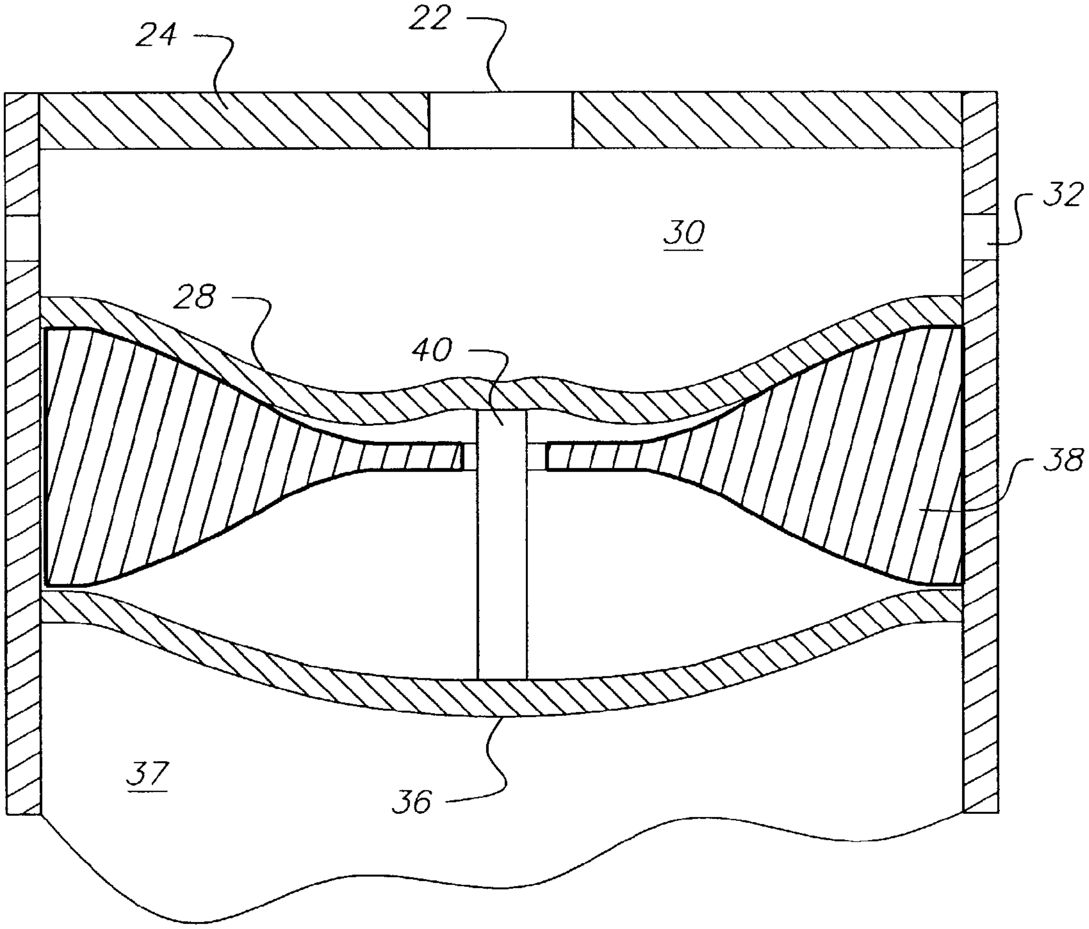
FIG. 6 is a cross-sectional view of the drop-on-demand liquid emission device of FIG. 2 shown in a first actuation stage.

Referring to FIG. 6, to eject a drop, voltage difference is applied between the polysilicon portion of addressable electrode 28 nearest to nozzle orifice 22 and the conductive portion of central electrode 38. The voltage of the conductive body of central electrode 38 and of the polysilicon portion of addressable electrode 36 are kept at the same. As shown in FIG. 6, addressable electrode 28 is attracted to central electrode 38 until it is deformed to substantially the surface shape of the central electrode, except in the region very near the central opening in the central electrode. In so conforming its shape, addressable electrode 28 presses down on addressable electrode 36 through rigid coupler 40, thereby deforming addressable electrode 36 downward, as shown in FIG. 6, and storing elastic potential energy in the system. Since addressable electrode 28 forms a wall portion of liquid chamber 30 behind the nozzle orifice, movement of electrode 28 away from nozzle plate 24 expands the chamber, drawing liquid into the expanding chamber through ports 32. Addressable electrode 36 does not receive an electrostatic charge, and moves in conjunction with addressable electrode 28.

The angle of contact between the lower surface of addressable electrode 28 and the upper surface of central electrode 38 is preferably less than 10 degrees. In a preferred embodiment, this angle tends to 0 degrees at the point of contact between the lower surface of addressable electrode 28 and the upper surface of central electrode 38. This ensures the voltage difference required to pull addressable electrode 28 down into contact with central electrode 38 is small compared with the value that would be required if the angle were larger than 10 degrees. For example, for the shape of central electrode 38 shown in FIG. 6, the voltage required is typically less than half that required for the case in which the angle of contact between the lower surface of addressable electrode 28 and the upper surface of central electrode 38 is 90 degrees, as can be appreciated by one skilled in the art of electrostatic actuators.

Figure 7:
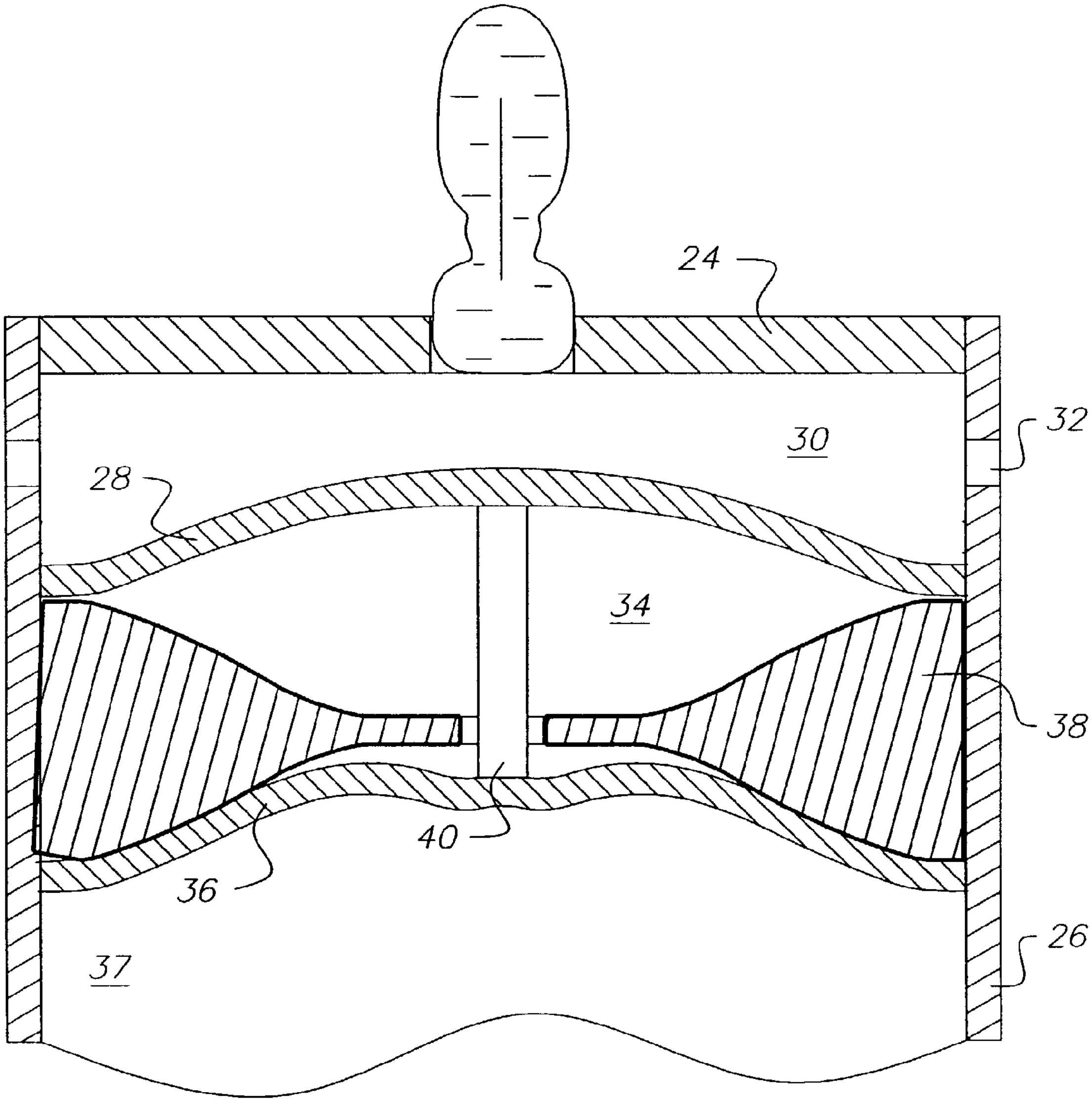
FIG. 7 is a cross-sectional view of the drop-on-demand liquid emission device of FIG. 2 shown in a second actuation stage.

Subsequently (say, several microseconds later) addressable electrode 28 is de-energized, that is, the potential difference between electrodes 28 and 38 is made zero, and addressable electrode 36 is energized by imposing a voltage difference between electrodes 36 and 38, causing addressable electrode 36 to be pulled toward central electrode 38 in conjunction with the release of the stored elastic potential energy. The timing of the de-energization of electrode 28 and the energization of electrode 36 may be simultaneous, or there may be a short dwell period therebetween so that the structure begins to move from the position illustrated in FIG. 6 toward the position illustrated in FIG. 7 under the sole force of stored elastic potential energy in the system. Still referring to FIG. 7, this action pressurizes the liquid in chamber 30 behind the nozzle orifice, causing a drop to be ejected from the nozzle orifice. To optimize both refill and drop ejection, ports 32 should be properly sized to present sufficiently low flow resistance so that filling of chamber 30 is not significantly impeded when electrode 28 is energized, and yet present sufficiently high resistance to the back flow of liquid through the port during drop ejection.

Figure 8:
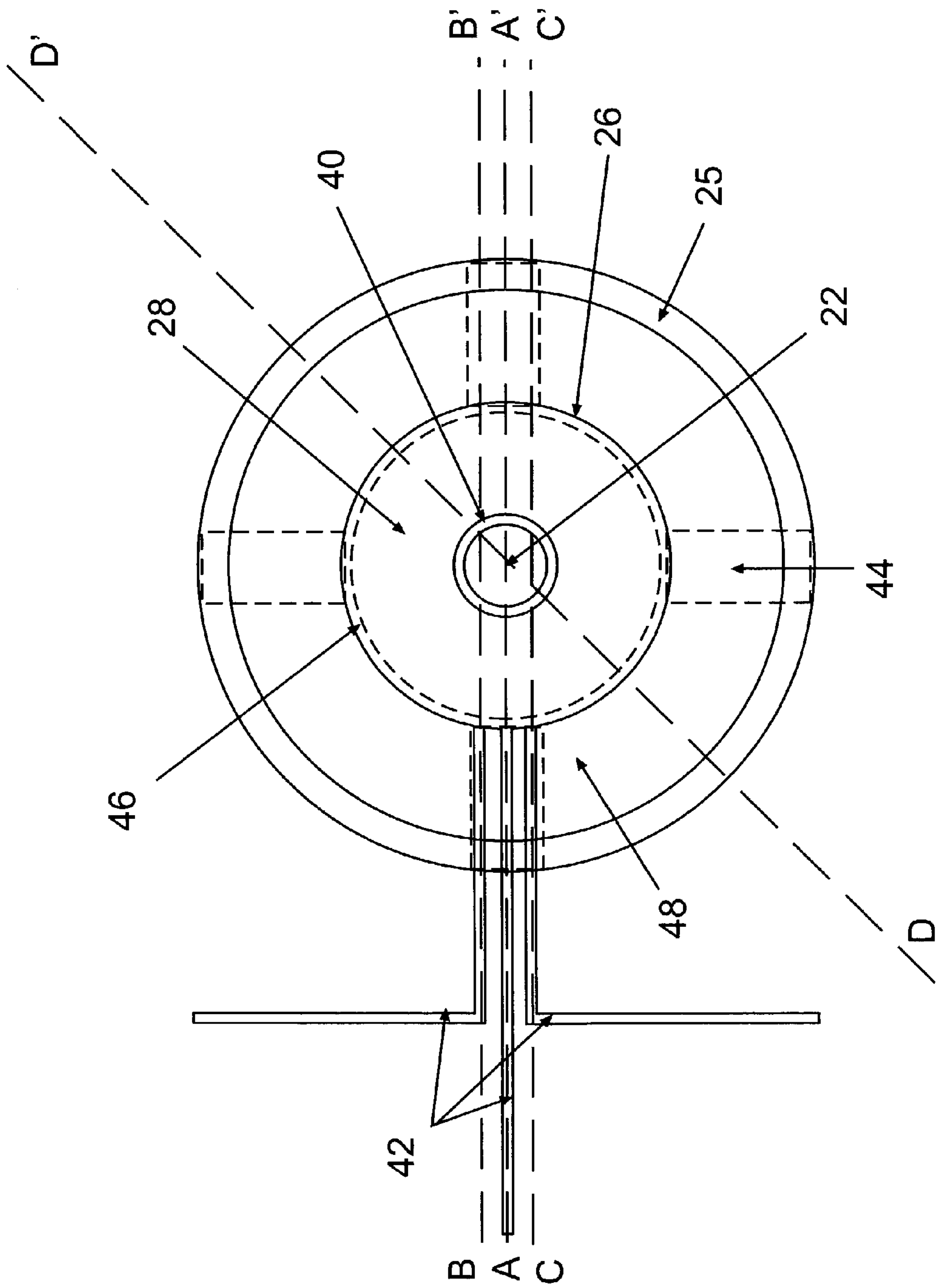
FIG. 8 is a top view of a portion of another embodiment of the liquid emission device of FIG. 1.

FIG. 8 is a top view of a portion of drop ejection mechanism 20 of FIG. 2 formed according to a preferred embodiment of the present invention. In this and the following figures, the structure continues to be illustrated in schematic form, but in somewhat more detail than in the previous figures.

Still referring to FIG. 8, during operation, electrical signals are sent via electrical leads 42 to the three electrodes 28, 36 and 38 of FIG. 2. The three-layer electrode structure is anchored to outer wall 25 by structural supports 44. Both the outer wall 25 and structural supports 44 may either comprise a single layer or comprise a stack of material layers as shown in FIG. 24. Rigid coupler 40 connects electrodes 28 and 36 of the three-layer electrode structure. A flow restrictor 46 (see also FIG. 21) prevents fluid from returning from liquid chamber 30 to the fluid reservoir (not visible here) via a fluid conduit 48 during drop ejection. A second fluid path 50 shown in FIG. 20 allows the dielectric fluid in region 37 to flow into and out of a dielectric fluid reservoir (not shown). In the preferred embodiment, the dielectric fluid is air, and the ambient atmosphere performs the function of a dielectric fluid reservoir.

A line A–A' in FIG. 8 indicates the plane of the cross-sections depicted in FIGS. 9–21, which illustrate a single drop ejector of many which would normally be batch fabricated simultaneously.

Figure 9:
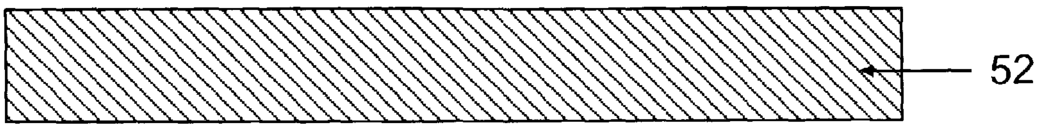
FIGS. 9–21 are cross-sectional views taken along line A–A' of FIG. 8 and showing the sequence of fabrication of a drop ejector.

FIG. 9 shows a substrate 52 of, say, a 550 $\mu$m thick, single crystal silicon wafer, for example. The substrate will be used to support the electrode structure and to form fluid conduits 48 that bring the fluid to nozzle orifice 22, and the second fluid paths 50 that bring the dielectric fluid to region 37.

Figure 10:
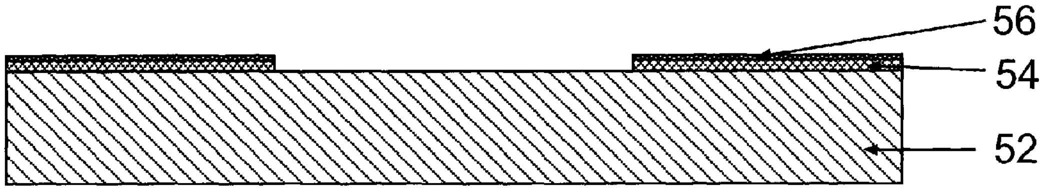

FIG. 10 shows the preferred embodiment after deposition, patterning, and etching of a first structural layer 54 (e.g. 0.75 $\mu$m thick doped polysilicon) and a first passivation layer 56 formed for example of 0.1 $\mu$m low pressure chemical vapor deposition (LPCVD) silicon nitride. These two layers are patterned using photolithography and etched away to form a depression that will allow addressable electrode 36 to deform toward substrate 52 during pullback. First passivation layer 56 insulates addressable electrode 36 from first structural layer 54 and substrate 52, which may both be formed of conductive materials.

Figure 11:
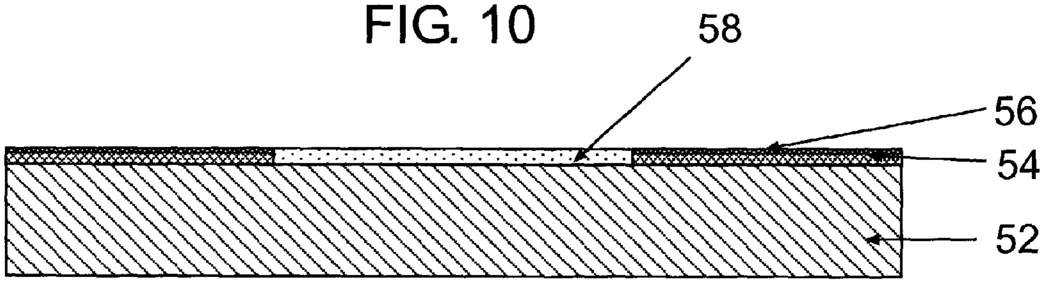
Figure 12:
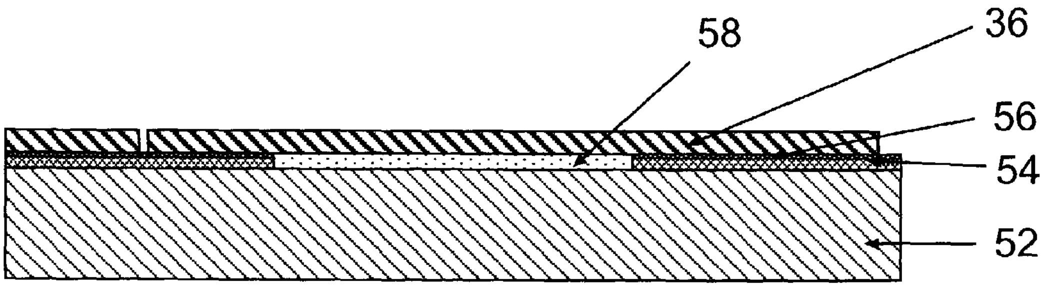

In FIG. 11, conformal deposition and planarization by chemical mechanical polishing (CMP) of an initial sacrificial layer 58 has occurred. The sacrificial layer may be, for example, 0.85 $\mu$m plasma enhanced chemical vapor deposition (PECVD) silicon dioxide, filling in the depression formed during the previous etch and providing a planar surface for the deposition of addressable electrode 36 as shown in FIG. 12. Addressable electrode 36 may be 3 $\mu$m to 5 $\mu$m doped polysilicon, and is relatively thick for a microdevice because it is advantageous to have a mechanically stiff electrode that will not easily deform, so that energy transfer from addressable electrode 36 to addressable electrode 28 through rigid coupler 40 is maximized when the addressable electrode 36 is energized to eject a drop. Although not shown in this figure, there are numerous perforations around the perimeter of the moving portion of addressable electrode 36 allowing it to move more easily. This reduces the energy required to pull the piston back to its "loaded" position.

Figure 13:
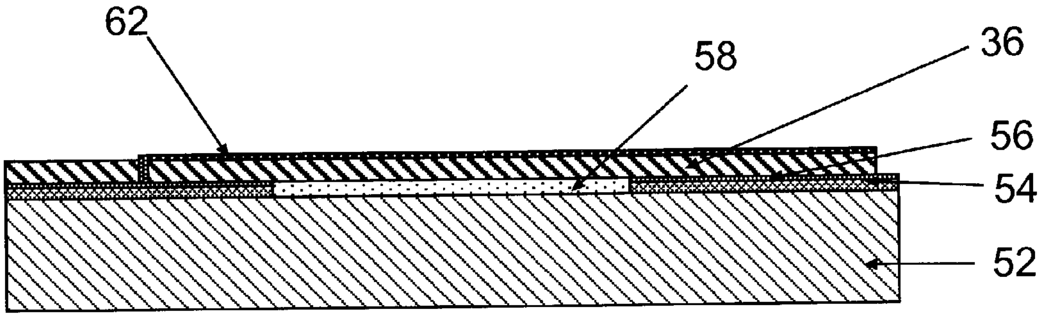

FIG. 13 shows the preferred embodiment after deposition, patterning, and etching of a second passivation layer 62 (e.g. 0.1 $\mu$m LPCVD silicon nitride). This layer provides electrical separation between addressable electrode 36 and central electrode 38, FIG. 15. LPCVD nitride is preferable to PECVD nitride in this layer, since the breakdown voltage of LPCVD nitride is higher, allowing a larger voltage to be supported without current leakage for the same layer thickness.

Figure 14A:
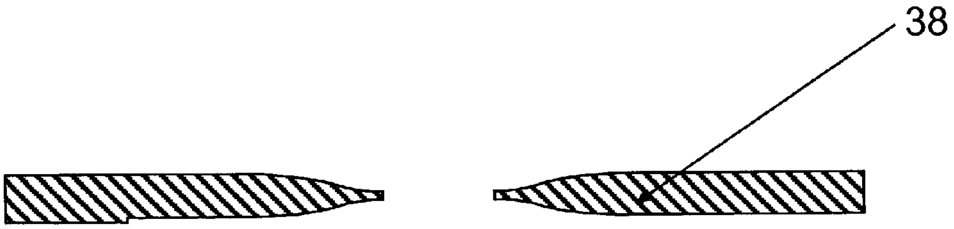

FIG. 14*a* shows a separately manufactured central electrode 38 (e.g. 10 $\mu$m stamped metal layer). This electrode is preformed before alignment by, for example, a two-sided stamping process. Electrode 38 is then dipped into a viscous conductive epoxy or lithographically stamped with a bonding agent such that only the bonding surface (i.e. the surface which will come into contact with the addressable electrode 36 or second passivation layer 62) is coated with the epoxy or bonding agent. The coated layer is then aligned to the features on the substrate (as shown in FIG. 14) and bonded through a combination of pressure, temperature, and/or exposure to electromagnetic radiation.

Figure 14B:
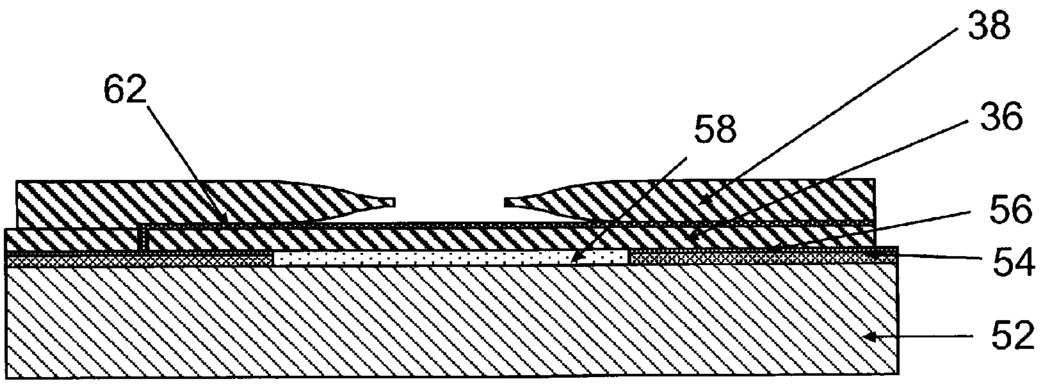

FIG. 14*b* shows the preferred embodiment after attachment, patterning, and etching of central electrode 38. This separates the devices from one another and forms the holes at the center of each membrane for penetration by spacer 40. Presumably the central electrode 38 could be separated externally and aligned individually, avoiding the need for a patterning and etch of the layer.

Figure 15:
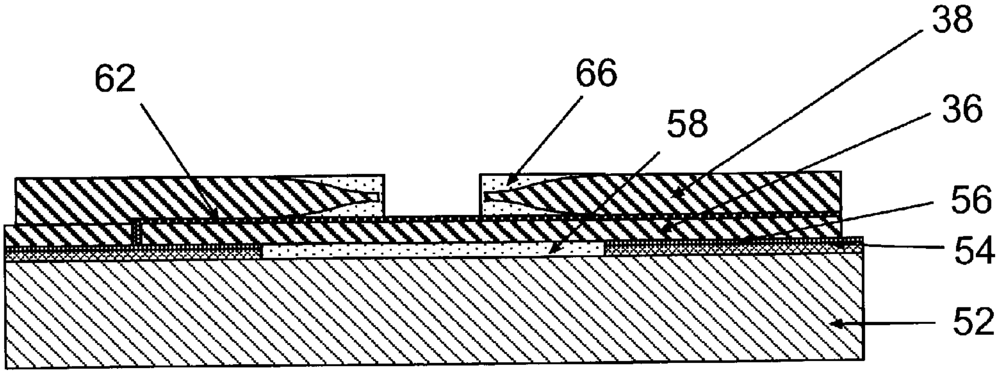

FIG. 15 shows the preferred embodiment after deposition, planarization (e.g. CMP), patterning, and etching of a third sacrificial layer 66 (e.g. 0.55 um silicon dioxide). This layer provides mechanical separation between second electrode layer 38 and third electrode layer 28. This step is provided for re-planarizing the system for deposition of third electrode layer 28. Third sacrificial layer 66 may not completely fill the area beneath the second electrode layer 38. This is immaterial as long as none of the previously deposited layers is exposed.

Figure 16:
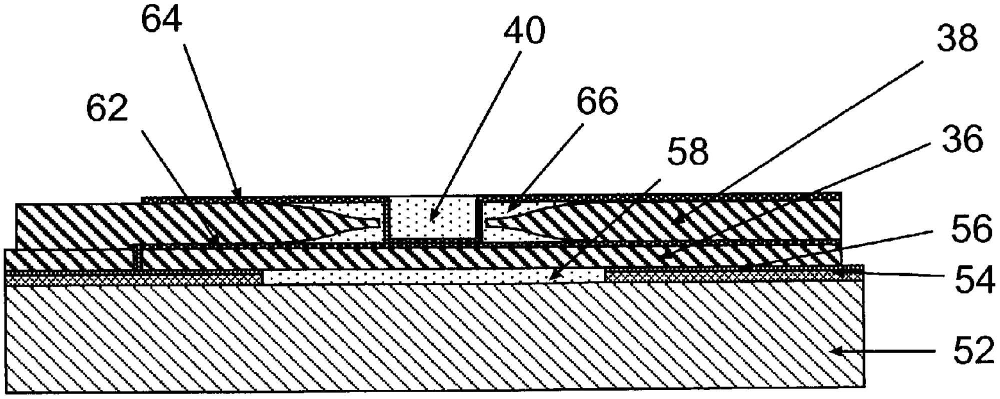

FIG. 16 shows the preferred embodiment after deposition, patterning, and etching of a third passivation layer 64 (e.g. 0.12 $\mu$m silicon nitride) and the deposition, planarization (e.g. CMP), patterning and etching of a rigid coupler 40. These layers mechanically couples first electrode layer 36 and third electrode layer 28, while insulating them from one another. This can be done in several ways. The method pictured is a thin insulating layer with its thickness determined by the breakdown voltage of the dielectric, followed by deposition of some other filler material as a second structural layer 40 (conductive or non-conductive) that is less expensive to deposit and planarize (e.g. spin-on polymer). Alternatively, a solid block of third passivation layer 64 can be employed. This would avoid the second deposition of structural layer 40, but it requires a thick deposition (at least the thickness of electrode 38) and planarization down to a thin layer with some accuracy. Another alternative is to leave the center hollow, and allow the third electrode layer to partially fill it. This has the advantage of a less costly process, but the disadvantage of being a structurally weaker spacer, since third passivation layer 64 must be kept thin to minimize the voltage required to operate the device. In addition, the third electrode layer 28 would become non-planar due to the dip at the center of third passivation layer 64.

Figure 17:
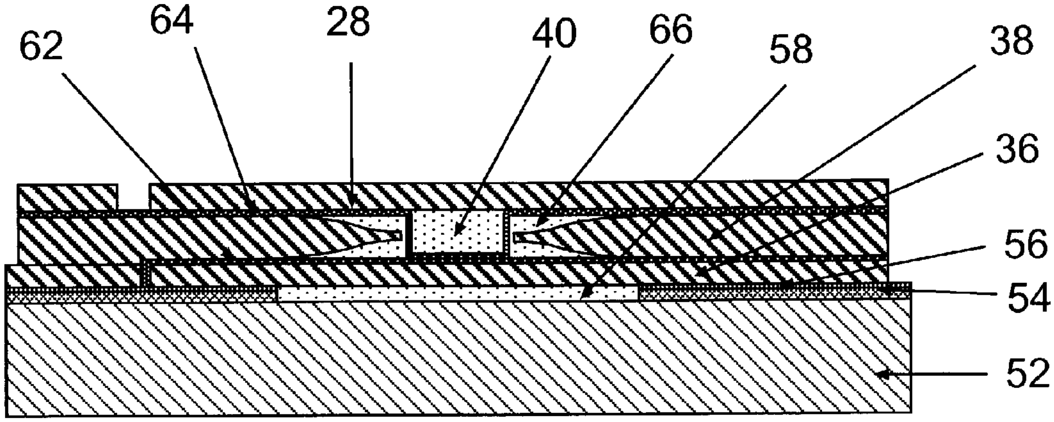
Figure 18:
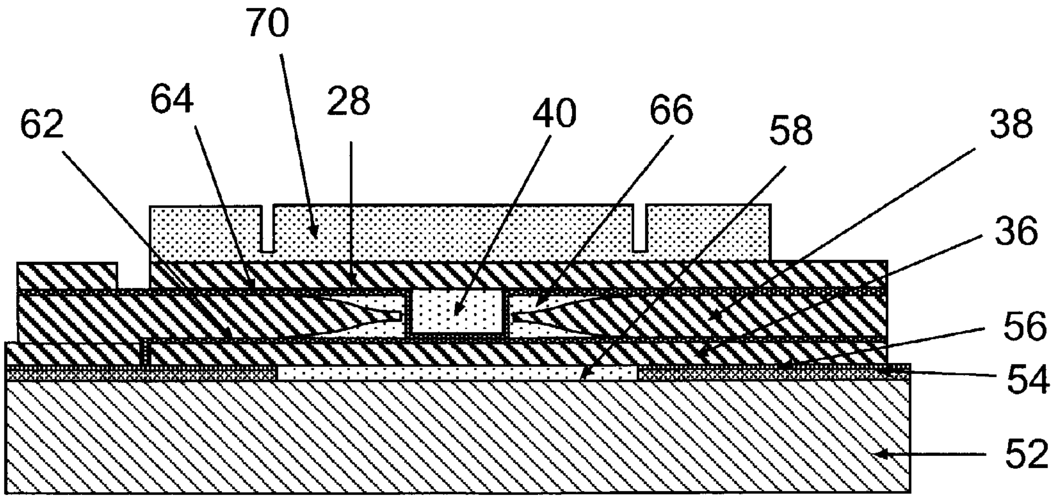

In FIG. 17, addressable electrode 28 (e.g. 2.5 μm doped polysilicon) has been deposited, patterned and etched. FIG. 18 shows the preferred embodiment after deposition, patterning, and etching of a third sacrificial layer 70 (e.g. 5 μm polyimide or silicon dioxide). This layer provides separation between addressable electrode 28 and nozzle plate 24 (FIG. 19) through which a drop will be ejected. The third sacrificial layer 70 will be eliminated later to form the liquid chamber 30. This layer is etched twice to different depths; once to provide a dimple that will create flow restrictor 46 (FIG. 8) that acts in conjunction with electrode 28 to form the input ports 32 (FIG. 2), and once to expose addressable electrode 28 for mechanical attachment.

Figure 19:
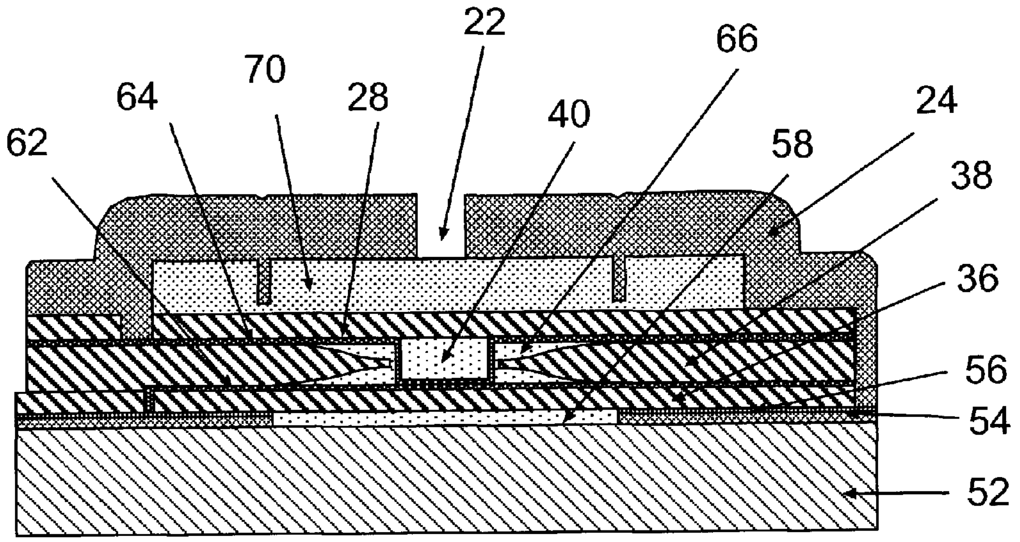
Figure 20:
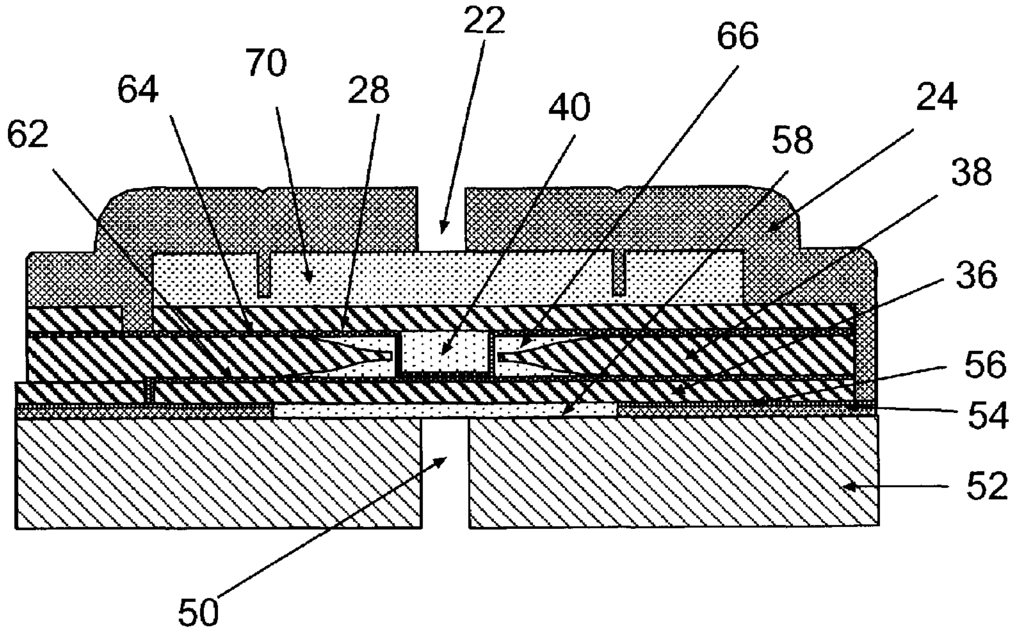

In FIG. 19, nozzle plate 24 of, for example, 4 μm nitride or polyimide (if not used for the third sacrificial layer) has been deposited, patterned and etched. The hole in this layer forms nozzle orifice 22 through which the drop is ejected. FIG. 20 shows the preferred embodiment after substrate 52 is etched from the back side (the side not previously patterned), opening holes to first passivation layer 56 and first sacrificial layer 58, which act as etch stops during this process.

Figure 21:
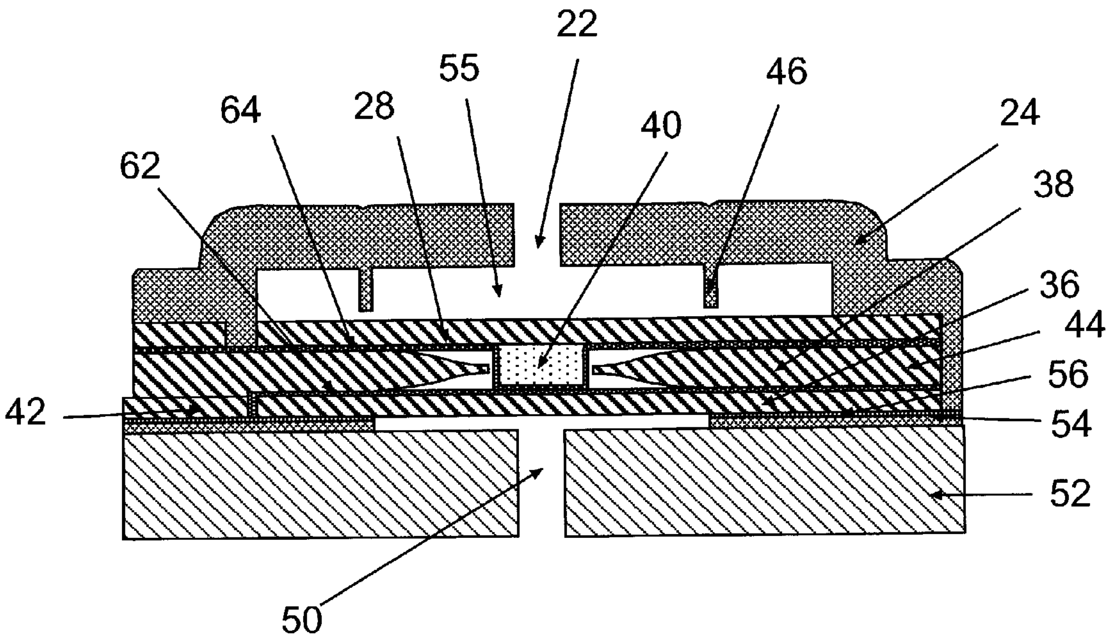
Figure 22:
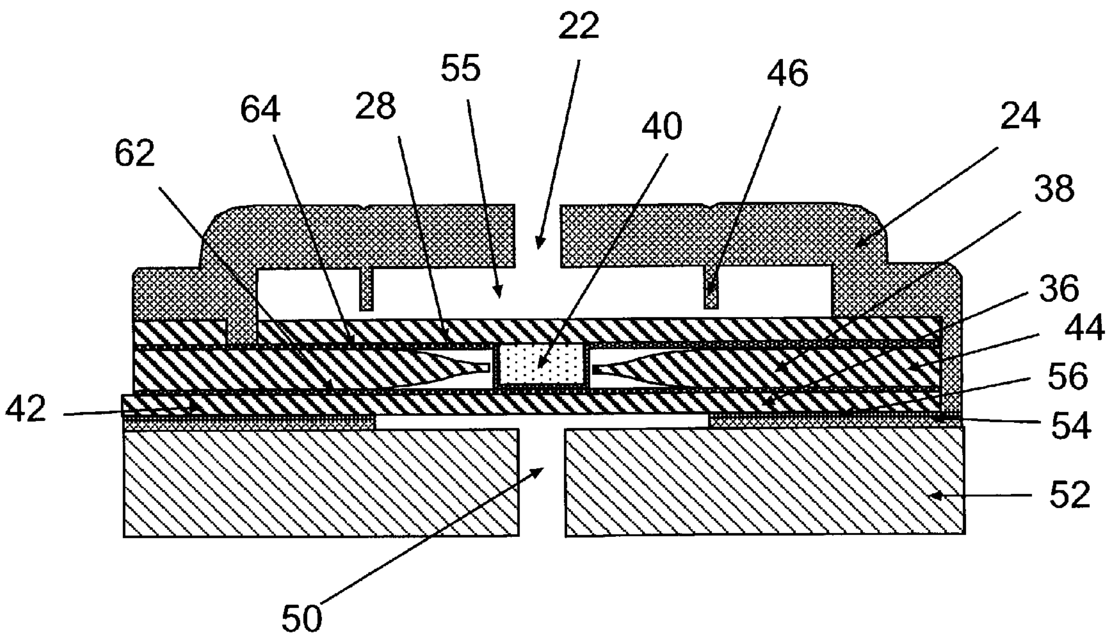
FIG. 22 shows a cross-section through B–B' of FIG. 8.
Figure 23:
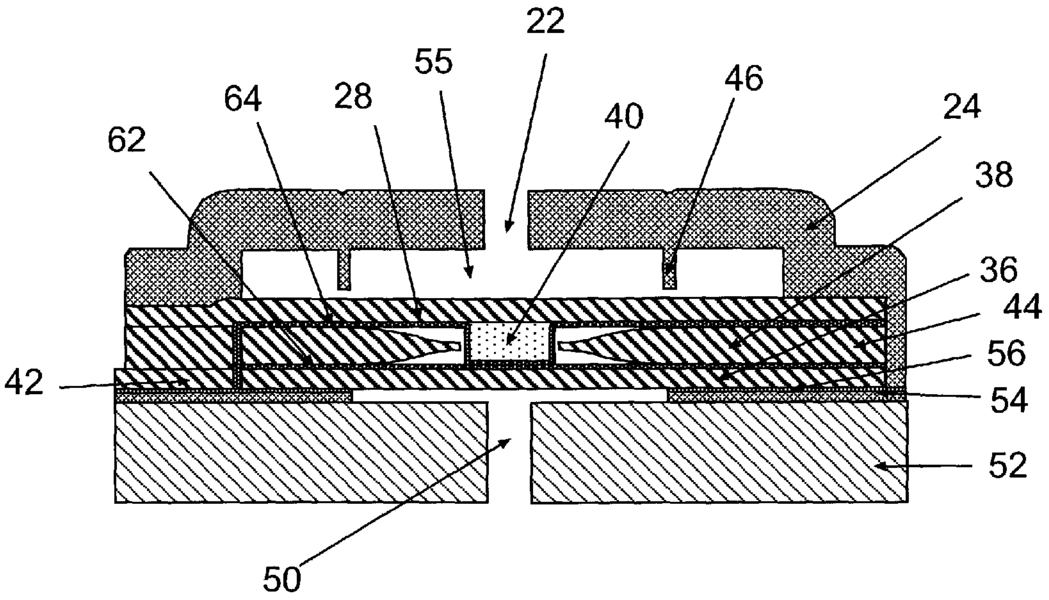
FIG. 23 shows a cross-section through C–C' of FIG. 8.

FIG. 21 shows the preferred embodiment after all sacrificial layers are removed (e.g. by immersion in HF to remove silicon dioxide sacrificial layers and/or by oxygen plasma to eliminate polyimide sacrificial layers). This is the completed device. Central electrode 38 is provided with external power through the lead 42 in this cross-section. FIG. 22 shows a cross-section through B–B' of the preferred embodiment in its finished state. The difference between this and the previous figure is the electrode structure on the left side, where addressable electrode 36 is provided with external power through lead 42 in this cross-section. FIG. 23 shows a cross-section through C–C' of the preferred embodiment in its finished state. The difference between this and the previous figure is the electrode structure on the left side, where addressable electrode 28 is provided with external power through lead 42 in this cross-section. FIG. 24 shows a cross-section through D–D' of the preferred embodiment in its finished state. The difference between this and the previous figure is that the region shown does not intersect any of the lead structure. This represents the region through which the fluid flows freely from the fluid conduit to the ejection chamber.

What is claimed is:

1. A method of making a multi-layer micro-electromechanical electrostatic actuator for producing drop-on-demand liquid emission devices, said method comprising:

forming an initial patterned layer of sacrificial material on a substrate;

depositing and patterning, at a position opposed to the substrate, a first electrode layer and a passivation layer on the initial layer of sacrificial material;

attaching, at a position opposed to the initial patterned layer and passivation layer, a preformed micropatterned conductive second electrode layer to the first electrode layer, said second electrode layer being (i) electrically isolated from the first electrode layer, and (ii) concave on opposed sides, increasing in thickness radially from a center of the second electrode layer;

forming a subsequent patterned layer of sacrificial material on the second electrode layer such that a region of the first electrode layer is exposed through an opening through the subsequent layer of sacrificial material;

depositing, patterning and planarizing a structure on the subsequent patterned layer of sacrificial material to a depth so as to at least fill the opening through the subsequent layer of sacrificial material;

depositing and patterning a third electrode layer on the structure and the exposed surface of the subsequent layer of sacrificial material, whereby the first electrode layer and the third electrode layer are attached by the structure; and removing sacrificial material from the initial layer and the subsequent layer, whereby the first electrode layer, the structure, and the third electrode layer are free to move together relative to the second electrode layer.

2. A method of making a multi-layer micro-electromechanical electrostatic actuator as set forth in claim 1 wherein the second electrode layer is formed by a two-sided stamping process.

3. A method of making a multi-layer micro-electromechanical electrostatic actuator as set forth in claim 1 wherein the second electrode layer is dipped into a viscous conductive epoxy such that only surfaces of the second electrode layer which will come into contact with the first electrode or the initial patterned layer is coated with the epoxy.

4. A method of making a multi-layer micro-electromechanical electrostatic actuator as set forth in claim 3 wherein the second electrode layer is bonded to the initial patterned layer by a combination of pressure, temperature, and/or exposure to electromagnetic radiation.

5. A method of making a multi-layer micro-electromechanical electrostatic actuator as set forth in claim 1 wherein the second electrode layer is 10 μm stamped metal.

6. A method as set forth in claim 1, wherein the region of the first electrode layer is exposed through the subsequent layer of sacrificial material by etching through the subsequent layer of sacrificial material.

7. A method as set forth in claim 1, wherein the initial sacrificial layer is formed by conformal deposition and planarization by chemical mechanical polishing of the sacrificial material.

* * * * *

UNITED STATES PATENT AND TRADEMARK OFFICE

CERTIFICATE OF CORRECTION

PATENT NO. : 6,966,110 B2
APPLICATION NO. : 10/254350
DATED : November 22, 2005
INVENTOR(S) : Michael J. DeBar et al.

It is certified that error appears in the above-identified patent and that said Letters Patent is hereby corrected as shown below:

Col. 8, Line 24 after "subsequent" insert -- patterned --

Signed and Sealed this

Twelfth Day of September, 2006

JON W. DUDAS
*Director of the United States Patent and Trademark Office*